United States Patent [19]

Breikss

[11] 4,122,359
[45] Oct. 24, 1978

[54] MEMORY PROTECTION ARRANGEMENT

[75] Inventor: Ivars P. Breikss, Littleton, Colo.

[73] Assignee: Honeywell Inc., Minneapolis, Minn.

[21] Appl. No.: 791,652

[22] Filed: Apr. 27, 1977

[51] Int. Cl.² ............................................. H02J 9/00
[52] U.S. Cl. ...................................... 307/64; 307/66;
307/200 A; 365/229
[58] Field of Search ...................... 307/64, 126, 23, 66,
307/200 A, 238, 100, 296 R; 340/333; 328/259,
264, 258; 365/229, 228

[56] References Cited

U.S. PATENT DOCUMENTS 3,859,638  1/1975  Hume ................................... 365/229

*Primary Examiner*—Robert K. Schaefer
*Assistant Examiner*—Morris Ginsburg
*Attorney, Agent, or Firm*—Laurence J. Marhoefer; Lockwood D. Burton

[57] ABSTRACT

A memory protection arrangement includes a primary power supply unit and a back-up battery. The back-up battery supplies maintenance energy to the memory itself, the battery being automatically effective whenever the primary power supply voltage decays to a value less than that of the battery. There is also provided apparatus which is responsive to a failure of the main power source to effect the application of a control signal to an input of the memory to disable the memory input from responding to spurious signals during a power-down condition.

4 Claims, 1 Drawing Figure

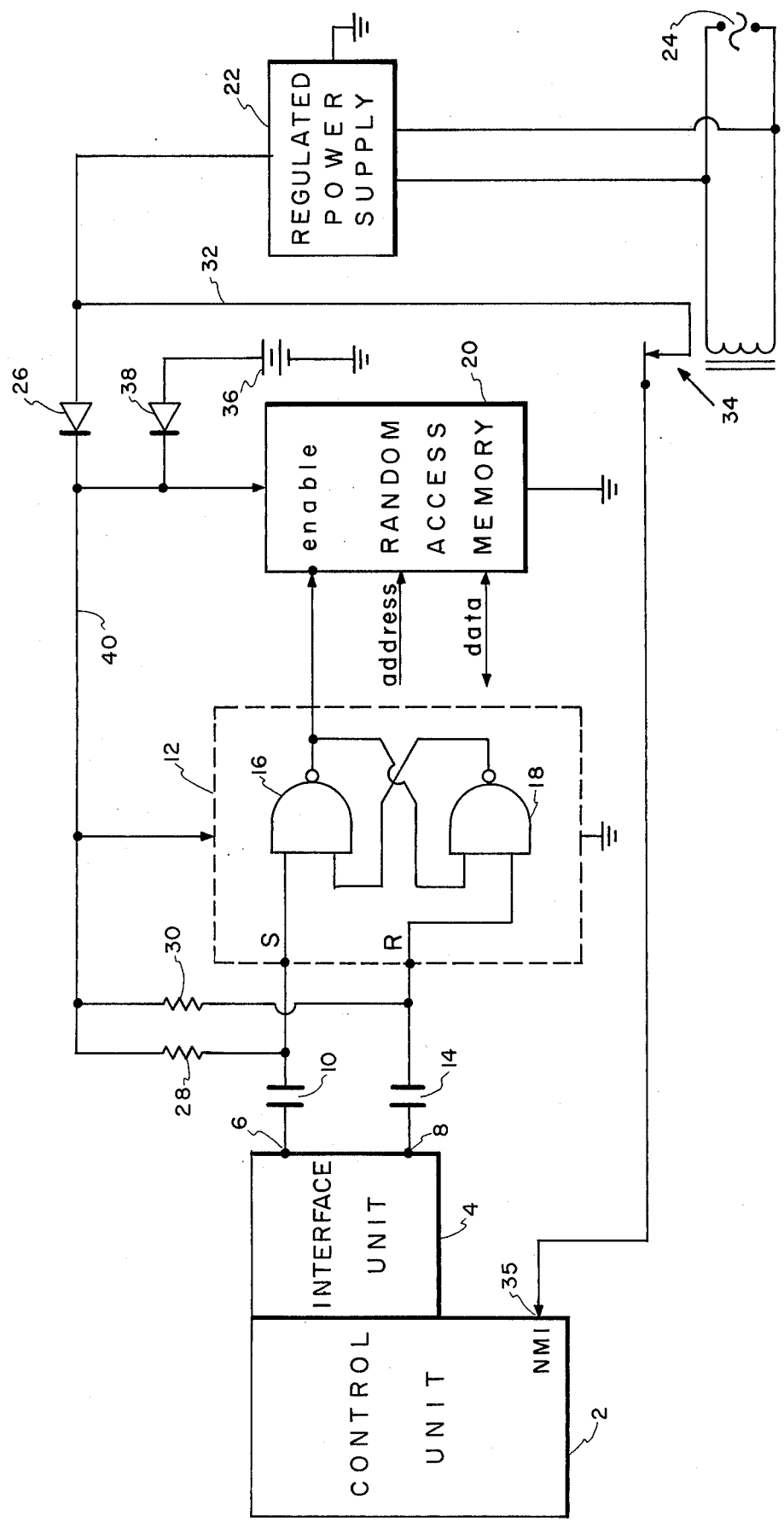

MEMORY PROTECTION ARRANGEMENT

BACKGROUND OF THE INVENTION

The present invention relates to computer control systems and, more particularly, to a memory protection arrangement for such systems.

With the advent of the microprocessor chip as a relatively inexpensive control element, many types of systems are provided wherein the operation of the apparatus is controlled by such a microprocessor under the direction of applied software. A critical element in such a system is a memory unit in which operating parameters are stored. It is essential that that memory be protected during power-up and power-down situations. To the end of maintaining the energization of the memory unit, there has been provided, heretofore, various schemes for utilizing a back-up battery. These previous schemes have involved complex circuitry for accomplishing the transfer. While some of those schemes have been successfully effective for the intended purpose, their complexity has made them less than totally satisfactory.

SUMMARY OF THE INVENTION

It is, accordingly, an object of the present invention to provide an improved memory protection arrangement.

It is another object of the present invention to provide an improved memory protection arrangement which is characterized in simplicity, structure and operation.

It is a further object of the present invention to provide a memory protection arrangement as set forth wherein the input to the memory is protected as well as the content.

In accomplishing these and other objects, there has been provided, in accordance with the present invention, a memory protection arrangement including a back-up battery to supply maintenance energy for the memory itself, the battery being automatically effective whenever the main power source decays to a voltage below the battery voltage. There is also provided apparatus which is responsive to the failure of the main power source to effect the application of a control signal to an input of the memory to disable the memory input from responding to spurious signals during a power-down condition.

BRIEF DESCRIPTION OF THE DRAWINGS

A better understanding of the present invention may be had from the following detailed description when read in the light of the accompanying drawing, in which:

The single FIGURE is a schematic logic diagram of apparatus embodying the present invention.

DETAILED DESCRIPTION

Referring now to the drawing in more detail, there is shown a control unit 2 which may, for instance, be a microprocessor control unit. On the other hand, it may be a more complex or larger scale computer control unit. Attached to the control unit 2 is an interface unit 4 having a first output terminal 6 and a second output terminal 8. The first terminal 6 is connected through a coupling capacitor 10 to a "set" input terminal of a flip-flop 12. The terminal 8 is connected through a coupling capacitor 14 to a "reset" input terminal of the flip-flop 12. The flip-flop 12 comprises a first NAND gate 16 cross-connected with a second NAND gate 18. The output of the flip-flop 12 is connected to an "enable" input terminal of a random access memory unit 12. The random access memory unit is provided also with the usual address and data communication channels. A regulated power supply unit 22 is energized from a conventional a.c. source 24. The output of the regulated power supply 22 is connected through a first diode 26 to a lead 40 to supply energizing current for the random access memory 20, for the flip-flop 12 and to supply a bias voltage signal through the resistors 28 and 30 to the "set" and "reset" input terminals of the flip-flop 12. A lead 32 from the regulated power supply 22 is connected to one contact of a relay switch 34. The other contact of the relay switch 34 is connected to a "non-maskable interrupt" input terminal 35 of the control unit 2. The operating winding of the relay switch 34 is connected across the a.c. source 24. A stand-by battery 36 has one terminal grounded while the other terminal is connected through a second diode 38 to the lead 40. The lead 40 is connected in energizing relationship with the random access memory 20, the flip-flop 12 and the input bias to the flip-flop circuit.

In operation, the control unit 2, under the direction of applied software, controls the operation of the associated apparatus. In an illustrative embodiment of the present invention, the controlled apparatus is a wideband, high performance tape recorder. In such a system, the parameters stored in the random access memory 20 include such variables as the footage count, tape speed, the operating modes, shuttle points for shuttle operation, selective track recording sequences and the like. These data are addressed and transferred into and out of the random access memory 20 on the address and data bus lines identified. During a power-down cycle of such a microprocessor system, the address and data lines assume, for several milliseconds, random logic stages. If such a situation were permitted, the content of the random access memory would likely become thoroughly confused and meaningless.

During the system start-up condition, and under the direction of the applied software, a short logic "1" pulse is generated at the first output terminal 6 of the interface unit 4. The negative going edge of that pulse is transmitted through the capacitor 10 to the "set" input terminal of the flip-flop 12, causing a logic "1" at the output terminal thereof. That logic "1" is applied to an "enable" input terminal of the random access memory 20. The logic "1" applied to the "enable" input of the random access memory enables the address and data terminals to be responsive to signals applied thereto in accordance with the control software. Inasmuch as the logic "1" "enable" signal was software generated, it is apparent that at the time of the generation of such "enable" signal, operating power must have been present prior to enabling the random access memory. That is, the system had gotten beyond the point where the probability of spurious random signals on the address and data bus lines would be present.

The random access memory, the flip-flop 12 and the input bias signals for the flip-flop 12 are energized from the regulated power supply 22 through the diode 26 and the lead 40. The relay 34 maintains the switch contacts thereof closed to apply a positive signal to the NMI input of the control unit. The positive signal at the NMI input terminal 35 leaves the control unit in uninterrupted operation. Upon a failure of the a.c. power source 24, the relay 34 substantially instantaneously drops out, opening the circuit from the power supply 22 to the NMI input terminal 35 producing, effectively, a negative signal at the NMI terminal 35. That signal instantly initiates an interrupt procedure in the control unit producing a logical "1" pulse at the output terminal 8 of the interface unit 4. The negative going edge of the pulse at the terminal 8 is transmitted through the capacitor 14 to the reset input terminal of the flip-flop 12, causing a logical "0" to appear at the output terminal 10 thereof. That logical "0" is applied to the "enable" input terminal of the random access memory, disabling the address and data terminals connected to the address and data bus lines.

The stand-by battery 36 is chosen to have an output voltage which is slightly less than the output voltage from the regulated power supply 22. Consequently, the battery 36 is inactive while the power supply 22 is effective because the diode 38 is back-biased, thereby blocking current flow from the battery 36 to the lead 40. Because of the nature of the regulated power supply 22, a time lapse on the order of 25 milliseconds occurs between the failure of the a.c. source 24 and the total loss of power from the output of the regulated power supply 22. Thus, the opening of the relay 34, which is substantially instantaneous, on the order of one or two milliseconds, the control unit 2 has adequate time to effect the interrupt procedure whereby to generate the disable signal at the input of the random access memory 20. As the output signal from the regulated power supply 22 decays to a value less than the value of the stand-by battery 36, the diode 38 becomes forwardly biased and the random access memory as well as the flip-flop 12 becomes energized from the stand-by battery 36 rather than the regulated power supply 22. Further, when the output voltage from the regulated power supply 22 decays to a value less than that of the stand-by or back-up supply 36, the diode 26 becomes back-biased, preventing current flow from the battery 36 back into the power supply 22. The energization and the bias applied to the input of the flip-flop 12 from the stand-by battery 36 maintains the flip-flop in its existing output state until the power-up condition has been restored and the system has been restarted. Thus, during the interval when the address and data lines of the random access memory may be subjected to spurious signals due to the power-down condition of the control unit, the inputs to the random access memory are disabled by the negative signal applied to the "enable" input terminal, thereby protecting both the inputs and the contents of the random access memory during a power-down condition. The content is maintained by the stand-by battery operating through the diode 38.

Thus, there has been provided, in accordance with the present invention, an improved memory protection arrangement wherein both the memory input and the memory content is protected during a power-down condition.

The embodiments of the invention in which an exclusive property or privilege is claimed are defined as follows:

1. In a computer control system including a random access memory means, said memory means having address and data communication terminals and an enable terminal whereby to selectively enable the input to said address and data terminals, a protection means for protecting the input and content of said memory means, said protection means comprising:

a primary power supply means connected to supply energizing power to said memory means,
a back-up power supply means,
means directly responsive to a fault condition in said primary power supply means for transferring energization of said memory means from said primary power supply means to said back-up power supply means, and
control signal means for producing a control signal representative of the operating condition of said primary power supply means,
said control signal means including a flip-flop circuit having an output terminal connected to said enable terminal of said memory means,
said flip-flop circuit being responsive to a first signal derived from said primary power supply means indicative that said primary power supply means is operational to produce an enable signal for said memory means to enable said memory means to respond to signals applied to said address and data terminals,
said flip-flop circuit being further responsive to a second signal derived from said primary power supply means indicative that said primary power supply means is not operational to produce a disable signal for said memory means to prevent said memory means from responding to signals applied to said address and data terminals.

2. In a computer control system including a random access memory means, said memory means having address and data communication terminals and an enable terminal whereby to selectively enable the input to said address and data terminals, a protection means for protecting the input and content of said memory means, said protection means comprising:

an energizing bus connected to supply energizing power to said memory means,
a primary power supply means connected to supply said energizing power to said bus,
a back-up power supply means,
means directly responsive to a fault condition in said primary power supply means for effectively transferring the energization of said bus from said primary power supply means to energization thereof by said back-up power supply means,
control signal means for producing a control signal representative of the operating condition of said primary power supply means,
said control signal means including a flip-flop circuit having an output terminal connected to said enable terminal of said memory means,
said flip-flop circuit being responsive to a first signal derived from said primary supply means indicative that said primary power supply means is operational to produce an enable signal at the output terminal thereof for application to said memory means to enable said memory means to respond to signals applied to said address and data terminals,
said flip-flop circuit being further responsive to a second signal indicative that said primary power supply means is not operational to produce a disable signal at the output terminal thereof for application to said memory means to prevent said memory means from responding to signals applied to said address and data terminals, and
means connecting said flip-flop circuit to said bus to be energized therefrom whereby said flip-flop circuit and said memory means are energized through said bus from said primary power supply means whenever said primary power supply means is operational, and from said back-up power supply means whenever said primary power supply means is not operational.

3. In a computer control system including a random access memory means, said memory means having address and data communication terminals and an enable terminal whereby to selectively enable the input to said address and data terminals, a protection means for protecting the input and content of said memory means, said protection means comprising:

an energizing bus connected to supply energizing power to said memory means,
a primary power supply means,
a first unidirectional conductive device connecting said primary power supply means to said bus,
a back-up power supply means,
a second unidirectional conductive device connecting said back-up power supply means to said bus,
said back-up power supply means having an output voltage slightly lower than that of said primary power supply means whereby to back-bias said second unidirectional conductive device whenever said primary power supply means is operational, said first unidirectional conductive device being back-biased and said second unidirectional conductive device being forwardly biased whenever said primary power supply means output voltage decreases to a value less than that of said back-up power supply means whereby to effect a transfer of the energization of said bus from said primary power supply means to said back-up power supply means upon such decrease in said output voltage from said primary power supply means,
control signal means for producing a control signal representative of the operating condition of said primary power supply means,
said control signal means including a flip-flop circuit having an output terminal connected to said enable terminal of said memory means,
said flip-flop circuit being responsive to a first signal indicative that said primary power supply means is operational to produce an enable signal at the output terminal thereof for application to said memory means to enable said memory means to respond to signals applied to said address and data terminals,
said flip-flop circuit being further responsive to a second signal indicative that said primary power supply means is not operative to produce a disable signal at the output terminal thereof for application to said memory means to prevent said memory means from responding to signals applied to said address and data terminals, and
means connecting said flip-flop circuit to said bus to be energized therefrom whereby said flip-flop circuit and said memory means are energized through said bus from said primary power supply means whenever said primary supply means is operational, and from said back-up power supply means whenever said primary power supply means is not operational.

4. The protection means as set forth in claim 3 and wherein said means connecting said flip-flop circuit includes bias means for applying a bias signal derived from said bus to input terminals of said flip-flop circuit.

* * * * *